(12) United States Patent
Kosaka

(10) Patent No.: US 6,876,841 B1
(45) Date of Patent: Apr. 5, 2005

(54) COMMUNICATION APPARATUS AND METHOD OF FABRICATING THE SAME

(75) Inventor: Masaru Kosaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/560,962

(22) Filed: Apr. 28, 2000

(30) Foreign Application Priority Data

Apr. 30, 1999 (JP) ............................................ 11-123614

(51) Int. Cl.$^7$ ............................................... H04B 1/10
(52) U.S. Cl. ...................... 455/300; 455/90.3; 455/347; 455/575.1
(58) Field of Search ................................. 455/300, 301, 455/347, 348–349, 350, 351, 117, 550.1, 575.1, 575.8, 90.3, 20, 525, 394, 296, 128; 361/816, 748, 752, 814, 850, 818; 174/35 R, 35 MS

(56) References Cited

U.S. PATENT DOCUMENTS

| | | | | | |
|---|---|---|---|---|---|
| 5,177,324 A | * | 1/1993 | Carr et al. | ................. | 174/35 R |
| 5,297,007 A | * | 3/1994 | Deyo et al. | ................. | 361/707 |
| 5,392,461 A | * | 2/1995 | Yokoyama | ................. | 455/90.2 |
| 5,585,806 A | * | 12/1996 | Ogino et al. | ......... | 343/700 MS |
| 5,603,103 A | * | 2/1997 | Halttunen et al. | ....... | 455/575.1 |
| 5,731,964 A | * | 3/1998 | Kitakubo et al. | ........... | 361/816 |
| 5,844,166 A | * | 12/1998 | Halttunen et al. | ........ | 174/35 R |
| 5,847,938 A | * | 12/1998 | Gammon | ..................... | 361/816 |
| 6,275,390 B1 | * | 8/2001 | Wu et al. | .................... | 361/818 |
| 6,275,683 B1 | * | 8/2001 | Smith | ...................... | 455/575.1 |
| 6,304,458 B1 | * | 10/2001 | Mendolia | .................... | 361/814 |
| 6,490,438 B1 | * | 12/2002 | Wu | .......................... | 455/90.1 |

FOREIGN PATENT DOCUMENTS

| | | | | | |
|---|---|---|---|---|---|
| EP | 926940 A1 | * | 6/1999 | ............ | H05K/9/00 |
| EP | 951209 A2 | * | 10/1999 | ............ | H05K/9/00 |
| JP | 7-221822 | | 8/1995 | | |
| JP | 8-279687 | | 10/1996 | | |
| JP | 8-298393 | | 11/1996 | | |
| WO | WO 9741718 A1 | * | 11/1997 | ............ | H05K/9/00 |

* cited by examiner

*Primary Examiner*—Pablo N. Tran
(74) *Attorney, Agent, or Firm*—Nixon & Vanderhye P.C.

(57) ABSTRACT

A communication apparatus including a radio frequency (RF) circuit module can be reduced in the number of components therefor to reduce the cost for its components and to simplify its fabrication process and thus reduce the cost for manufacturing the same while the RF circuit module can also be shielded reliably. The RF circuit module includes a printed circuit board having an upper surface with a circuit component mounted thereto and a lower surface provided with a shielding conductor of metal. The printed circuit board is fit into a shielding frame to assemble the RF circuit module. The RF circuit module is then turned over and thus mounted on that upper surface of a mother board which is provided with conductors of metal. Such conductors of metal and the frame can shield the RF circuit module.

6 Claims, 6 Drawing Sheets

COMMUNICATION APPARATUS AND METHOD OF FABRICATING THE SAME

BACKGROUND OF THE INVENTION

1. Field of the Invention

The present invention relates to communication apparatuses capable of high frequency signal transmission, such as cordless phones and mobile phones, and methods of fabricating the same. More specifically the present invention relates to an improvement in a configuration for effectively shielding a radio frequency (RF) circuit module accommodated inside internal to such communication apparatuses.

2. Description of the Background Art

Conventionally, as disclosed for example in Japanese Patent Laying-Open No. 7-221822, cordless phones, mobile phones and other communication apparatuses accommodate a RF circuit module for processing signals to be transmitted and received. Such RF circuit module is mounted to a mother board. FIG. 9 is an exploded, perspective view of a typical RF circuit module and a perspective view of a mother board a. As shown in the figure, the RF circuit module is provided by integrally assembling a shielding frame b, a printed circuit board c accommodated in and held by frame b, and a pair of upper and lower shielding lids d and e closing the frame's upper and lower openings, respectively.

Frame b has protrusions b1 and notches b2 for holding printed circuit board c. Frame b also has four lower corners, each adjacent to a grounding tab b3 grounding mother board a.

Printed circuit boardchas a lower surface provided with grounding conductors c1 for grounding frame b, positionally corresponding to notch b2. To printed circuit board c are mounted a circuit pattern (not shown), adjustment components f for adjusting the communication apparatus's electrical performance, and connection terminals g allowing printed circuit board c to be electrically connected to mother board a.

Lids d and e each have an outer periphery provided with flaps d1 and e1, respectively, fitting into frame b downwards and upwards, respectively. Upper lid d has holes d2 allowing adjustment components f on printed circuit board c to be externally adjusted. Lower lid e has an opening e2 through which connection terminals g the printed circuit board pass.

In assembling the RF circuit module, printed circuit board c is initially inserted into frame b upwards until printed circuit board c abuts against protrusions b1. Then, as shown in FIG. 10, showing the frame's inside upwards, the notch's flap b4 is bent inwards. Thus printed circuit board cis held internal to frame b. Then flap b4 and grounding conductor c1 are soldered together, as shown in FIG. 10 with a dashed region A, to electrically connect grounding conductor c1 and flap b4 together. Then lids d and e are fit into frame b downwards and upwards, respectively. Thus, above adjustment components fare situated the upper lid's adjustment holes d2, while printed circuit board c has connection terminals g passing through the lower lid's opening e2 and thus protruding downwards. Thus, printed circuit board c has its outer periphery substantially entirely surrounded by frame b and lids d and e and thus shielded thereby.

When The RF circuit module thus fabricated has its frame's tabs b3 inserted into the mother board's mounting holes a1, the printed circuit board's connection terminals g are also simultaneously inserted into the mother board's terminal insertion holes a2. Thus the RF circuit module and mother board a are electrically connected together and integrally assembled.

As described above, a RF circuit module is configured of frame b, printed circuit board c and a pair of upper and lower lids d and e and fabricated by successively assembling such components.

For such type of module, there is a need for minimizing the number of components therefor to reduce the cost for them and to simplify its assembly process to reduce the cost for manufacturing the same.

Conventionally, however, nothing but the configuration as described above has in effect been applied to reliably shield the RF circuit module.

SUMMARY OF THE INVENTION

The object of the present invention is to reduce the number of components of a communication apparatus with a radio frequency (RF) circuit module, to reduce the cost for its components and to simplify its fabrication process and thus reduce the cost for manufacturing the same while ensuring that the RF circuit module is also shielded.

To achieve the above object the present invention can provide a printed circuit board and mother board also serving as a shield to dispense with a conventional shielding lid.

More specifically, in accordance with the present invention a first solution is to provide a printed circuit board itself also serving as a shield. More specifically, in the first solution a communication apparatus is adapted to include a RF circuit module having a shielding frame and a printed circuit board accommodated in and held by the shielding frame and a mother board to which the RF circuit module is mounted. In the communication apparatus the printed circuit board has one surface with a circuit component mounted thereto and the other surface provided with a shielding conductor of metal having substantially the same shape as a plane of the printed circuit board or a layer internal thereto that corresponds to such shielding conductor of metal. Furthermore, the RF circuit module is mounted to the mother board, with one surface of the printed circuit board opposite to the mother board.

The first solution can provide a printed circuit board with a conductor of metal serving as a shield. As such the apparatus can dispense with a shielding lid covering the other side of the printed circuit board. In other words, the printed circuit board also serving as a shield eliminates the necessity of assembling a shielding lid and also allows the number of the apparatus's components to be reduced.

In a second solution the mother board itself may also serve as a shield. More specifically, in the second solution a communication apparatus is adapted as in the first solution plus a shielding conductor of metal provided at that portion of the mother board on which the RF circuit module is mounted.

The second solution can provide a mother board with a conductor of metal serving as a shield. As such the apparatus can dispense with a shielding lid covering that side of the printed circuit board opposite to the mother board. In other words, the mother board also serving as a shield eliminates the necessity of assembling a shielding lid and also allows the number of the apparatus's components to be reduced.

In the third solution the printed circuit board and the mother board can each also serve as a shield. More specifically the third solution is the first solution plus a shielding conductor of metal provided at that portion of the mother board on which the RF circuit module is mounted.

The third solution can achieve the aforementioned effects of the first and second solutions, dispensing with shielding lids covering opposite sides of the printed circuit board. Thus any shielding lids so far required can be completely eliminated. This can reduce the number of components for the apparatus and hence the number of process steps for fabricating the apparatus.

The fourth solution relates to an improvement allowing the RF circuit module's electrical performance to be readily adjusted. More specifically the fourth solution is the first solution wherein an adjustment component for adjusting the RF circuit module's electrical performance is provided as one of circuit components mounted to one surface of the printed circuit board. Furthermore, in the printed circuit board at a location where the adjustment component is mounted there is an adjustment hole formed to allow the adjustment component to be adjusted external to the RF circuit module mounted to the mother board.

The fourth solution can provide an adjustment hole allowing a RF circuit module's adjustment component to be adjusted external to the RF circuit module after the RF circuit module is mounted to a mother board. As such the adjustment component can be adjusted as required and appropriate to ensure that the RF circuit module has constant, optimized electrical performance.

The fifth solution relates to an improvement for preventing the mother board's shielding conductor of metal from affecting the RF circuit module's electrical performance. More specifically the fifth solution is the second and third solutions plus the printed circuit board having an adjustment component mounted thereto for adjusting the RF circuit module's electrical performance. Furthermore the shielding conductor of metal for the mother board is provided on the mother board at a region other than that region opposite to the adjustment component.

The fifth solution can eliminate any shielding conductor of metal existing on the mother board at that portion opposite to the adjustment component. As such the RF circuit module having had the adjustment component appropriately adjusted to appropriately adjust the RF circuit module's electrical performance before it is mounted to the mother board would not have the adjustment component affected by the mother board's shielding conductor of metal nor would its electrical performance vary after it is mounted to the mother board. As such the RF circuit module can have an electrical performance optimally maintained even after it is mounted to the mother board.

The sixth solution relates to an improvement for miniaturizing the RF circuit module. More specifically the sixth solution is the first, second or third solution with the printed circuit board having a circuit component mounted thereto and the mother board also having a circuit component mounted thereto opposite to the circuit component mounted to the printed circuit board.

The sixth solution allows some of circuit components so far mounted to the printed circuit board to be mounted to the mother board. This can reduce a space for mounting a circuit component required for the printed circuit board and thus miniaturize the RF circuit module.

The seventh solution relates to an improvement for reducing the RF circuit module's thickness. More specifically the seventh solution is the first or third solution with the printed circuit board accommodated in and held by the shielding frame and thus having the other surface thereof level with one end surface of the shielding frame.

The seventh solution can minimize the shielding frame in height, as required, and thus reduce the RPM circuit module in thickness.

The eighth solution is directed to a method of fabricating a communication apparatus, relating to an improvement for appropriately adjusting an adjustment component. More specifically it is directed to a method of fabricating a communication apparatus with a mother board having mounted thereto a RF circuit module having a shielding frame and a printed circuit board accommodated in and held by the shielding frame. In this method the printed circuit board may have an adjustment component mounted thereto for adjusting the RF circuit module's electrical performance while at that portion of the mother board where the RF circuit module is to be mounted there may be provided a shielding conductor of metal. In fabricating the communication apparatus, before the RF circuit module is mounted to the mother board the RF circuit module is arranged opposite to an adjusting conductor of metal similar to the shielding conductor of metal of the mother board to adjust the adjustment component on the printed circuit board. After the adjustment component is thus adjusted the RF circuit module is mounted to the mother board.

In the eighth solution an adjusting conductor of metal arranged opposite to a RF circuit module can be positionally equivalent to a mother board with a RF circuit module mounted thereto. In other words the RF circuit module is virtually mounted to the mother board. The RF circuit module arranged opposite to the adjusting conductor of metal and thus having the adjustment component precisely adjusted to allow the RF circuit module to have optimal electrical performance, can also have a similar optimal performance when it is actually mounted to the mother board. Thus it is not necessary to consider how the RF circuit module is affected by the shielding conductor of metal of the mother board when it is mounted to the mother board.

Simply put, in accordance with the present invention in one aspect a communication apparatus includes a radio frequency circuit module, and a mother board having one surface to which the radio frequency circuit module is mounted. The radio frequency circuit module includes a shielding frame, a printed circuit board having one and the other surfaces and accommodated in and held by the shielding frame, a circuit component mounted on one surface of the printed circuit board, and a shielding conductor arranged on the other surface of the printed circuit board or inside the printed circuit board and having a shape substantially matching a planar shape of the printed circuit board. The radio frequency circuit module is mounted on one surface of the mother board such that one surface of the printed circuit board faces one surface of the mother board.

In accordance with the present invention in one aspect preferably the communication further includes a shielding conductor arranged on one surface of the mother board where the radio frequency circuit module is mounted. Furthermore the communication apparatus may also include another shielding conductor surrounding the shielding conductor arranged on one surface of the mother board where the radio frequency circuit module is mounted, and another shielding conductor may be joined to the shielding frame. More preferably the circuit component includes an adjustment component for adjusting the radio frequency circuit module's electrical performance and the shielding conductor is arranged on one surface of the mother board at a region other than that region opposite to the adjustment component.

Preferably the circuit component includes an adjustment component for adjusting the radio frequency circuit module's electrical performance and the adjustment component is mounted to the printed circuit board at a location having a throughhole penetrating from one surface of the printed circuit board through the other surface of the printed circuit board.

In accordance with the present invention in one aspect preferably the communication apparatus includes a first circuit component mounted on one surface of the printed circuit board, and a second circuit component mounted on one surface of the mother board, opposite to the first circuit component. More preferably the first circuit component includes one of a transmitter's circuit component and a receiver's circuit component and the second circuit component includes the other of the transmitter's circuit component and the receiver's circuit component.

Preferably, with the printed circuit board accommodated in and held by the shielding frame, the other surface of the printed circuit board and one end surface of the shielding frame are substantially level with each other.

In accordance with the present invention in another aspect a communication apparatus includes a radio frequency circuit module, a mother board to which the radio frequency circuit module is to be mounted, the radio frequency circuit module including a shielding frame and a printed circuit board accommodated in and held by the shielding frame, and a shielding conductor arranged at that portion of the mother board where the radio frequency circuit module is mounted.

In accordance with the present invention in another aspect preferably the communication apparatus also includes another shielding conductor surrounding the shielding conductor arranged on one surface of the mother board where the radio frequency circuit module is mounted, and another shielding conductor is joined to the shielding frame.

Preferably the radio frequency circuit module includes an adjustment component mounted on the printed circuit board for adjusting the radio frequency circuit module's electrical performance and the shielding conductor is arranged on the mother board at a region other than that region opposite to the adjustment component.

In accordance with the present invention in another aspect preferably the communication apparatus includes a first circuit component mounted on one surface of the printed circuit board, and a second circuit component mounted on one surface of the mother board, opposite to the first circuit component. Still preferably the first circuit component includes one of a transmitter's circuit component and a receiver's circuit component and the second circuit component includes the other of the transmitter's circuit component and the receiver's circuit component.

In accordance with the present invention in still another aspect a method of manufacturing a communication apparatus includes the steps of: providing a radio frequency circuit module including a shielding frame and a printed circuit board accommodated in and held by the shielding frame, the printed circuit board having an adjustment component mounted thereon for adjusting the radio frequency circuit module's electrical performance; providing a mother board having a surface with a shielding conductor arranged; mounting the radio frequency circuit module on the mother board's shielding conductor; and, before the step of mounting the radio frequency circuit module, adjusting the adjustment component, with the radio frequency circuit module arranged opposite to an adjusting conductor equivalent to the mother board's shielding conductor.

The present invention can achieve such effects as follows:

In accordance with the present invention a RF circuit module included in a communication apparatus can have a printed circuit board itself also serving as a shield to dispense with a conventionally used shielding lid. As such the RF circuit module can be reduced in the number of components thereof to reduce the cost for its components and to simplify its fabrication process and thus reduce the cost for manufacturing the same while the RF circuit module can also be shielded reliably.

In accordance with the present invention the mother board can also serve as a shield to dispense with a conventionally used shielding lid. As such the RF circuit module can be configured of a reduced number of components to achieve an effect similar to the aforementioned effect of the invention.

In accordance with the present invention the printed circuit board and the mother board can each also serve as a shield. Thus the aforementioned effects of the present invention can both be achieved. As such, conventionally required shields can be completely removed and as the number of components for the communication apparatus is significantly reduced the number of process steps for manufacturing the communication apparatus can also be significantly reduced to achieve an improved production efficiency.

In accordance with the present invention, in the printed circuit board at a location where an adjustment component is mounted there can be provided an adjustment hole allowing the adjustment component to be adjusted external to the RF circuit module. As such the adjustment component can be adjusted as required and as appropriate even after the RF circuit module is mounted to the mother board. This ensures that the RF circuit module can constantly have an optimized electrical performance to improve the reliability of the communication apparatus.

In accordance with the present invention a shielding conductor of metal for the mother board can be provided on the mother board at a region other than that opposite to the adjustment component to prevent the adjustment component of the printed circuit board mounted to the mother board from being affected by the shielding conductor of metal of the mother board and thus prevent the RF circuit module from varying in electrical performance. Thus the RF circuit module can have an electrical performance constantly appropriately maintained and the communication apparatus can thus be improved in reliability.

In accordance with the present invention there can be provided the printed circuit board and the mother board with their respective circuit components mounted opposite to each other. Thus the RF circuit module does not need a large space thereon for mounting its component and the RF circuit module can thus be miniaturized. Thus the communication apparatus can also be miniaturized and reduced in weight.

In accordance with the present invention the printed circuit board accommodated in and held by a shielding frame can have the other surface arranged level with one end surface of the shielding frame. As such the shielding frame can be minimized in height, as required, and the RF circuit module can thus be reduced in thickness. Thus the communication apparatus can also be miniaturized and reduced in weight.

In accordance with the present invention, in fabricating a communication apparatus, before the RF circuit module is mounted to the mother board the RF circuit module can be arranged opposite to an adjusting conductor of metal similar to the shielding conductor of metal of the mother board to adjust an adjustment component of the printed circuit board. In other words the RF circuit module is virtually mounted to the mother board to adjust the adjustment component. This allows the RF circuit module to have optimal electrical performance when it is mounted to the mother board. As such it is not necessary to consider how the RF circuit module is affected by the shielding conductor of metal of the mother board when it is mounted to the mother board. Thus the communication apparatus can be fabricated efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the embodiment of the present invention will be described with reference to the drawings. The embodiments will be described in conjunction with a mobile phone adopted as a communication apparatus in accordance with the present invention.

First Embodiment

A first embodiment of the present invention will first be described.

Radio Frequency (RF) Circuit Module and Mother Board

Figure 1:
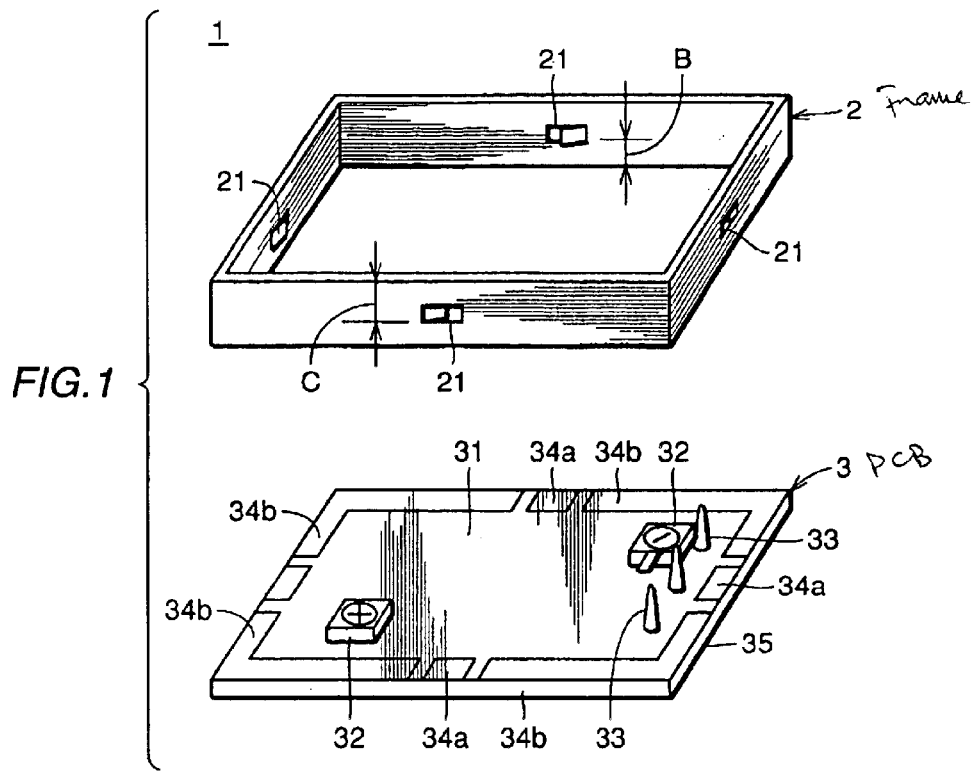
FIG. 1 is an exploded, perspective view of a RF circuit module according to a first embodiment of the present invention.

FIG. 1 is an exploded, perspective view of a RF circuit module 1 incorporated into a mobile phone. As shown in the figure, RF circuit module 1 includes a frame 2 and a printed circuit board 3 accommodated in and held by frame 2. Such components 2 and 3 will now be described.

Frame 2 is formed of a plate member of metal bent to form a rectangle, as seen in a planar view, to provide a space for accommodating printed circuit board 3 internal thereto. Frame 2 has protrusions 21 for positioning printed circuit board 3. Protrusion 21 corresponds to a center portion of the frame's each side that is notched in the form of the U letter rotated counterclockwise by 90 degree and is bent inward of frame 2. The distance between the protrusion's lower edge and the frame's lower end (in FIG. 1, the dimension B) generally matches the printed circuit board 3 thickness.

Printed circuit board 3 has an upper surface 31 with a circuit pattern (not shown), a plurality of circuit components 32 and connection terminals 33 mounted thereon. Connection terminal 33 is used to achieve electrical connection to mother board 4 (shown in FIG. 2) and it's protrusion from the printed circuit board's upper surface 31 is slightly greater than the distance between the frame's protrusion 21 lower edge and the frame's upper end (in FIG. 1, the dimension C).

Printed circuit board 3 also has a shape generally matching that of the frame's internal space, as seen in a planar view. Printed circuit board 3 is also provided with grounding conductors 34a and 34b on its upper surface along a periphery. Grounding conductors 34a and 34b include a first conductor 34a soldered to the frame's protrusion 21 and a second conductor 34b soldered to the frame's inner surface. The first conductor 34a is arranged at a center portion of each side of printed circuit board 3, opposite to the frame's protrusion 21. The second conductor 34b is provided along the entirety of an outer periphery of the printed circuit board except where the first conductor 34a is arranged.

Figure 4:
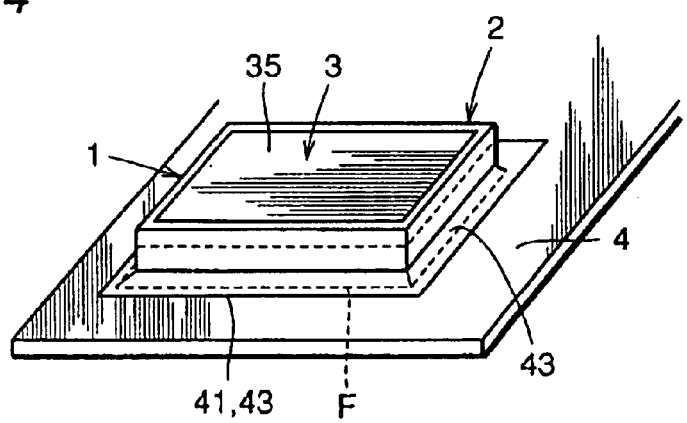
FIG. 4 is a perspective view for illustrating how a RF circuit module is mounted to a mother board.

Furthermore, as a characteristic of printed circuit board 3 of the present invention, printed circuit board 3 has its entire lower surface provided with a conductor of metal 35 (see FIG. 4). Conductor of metal 35 is for example stuck to the lower surface of printed circuit board 3. Thus conductor of metal 35 is provided as a ground plane.

Figure 2:
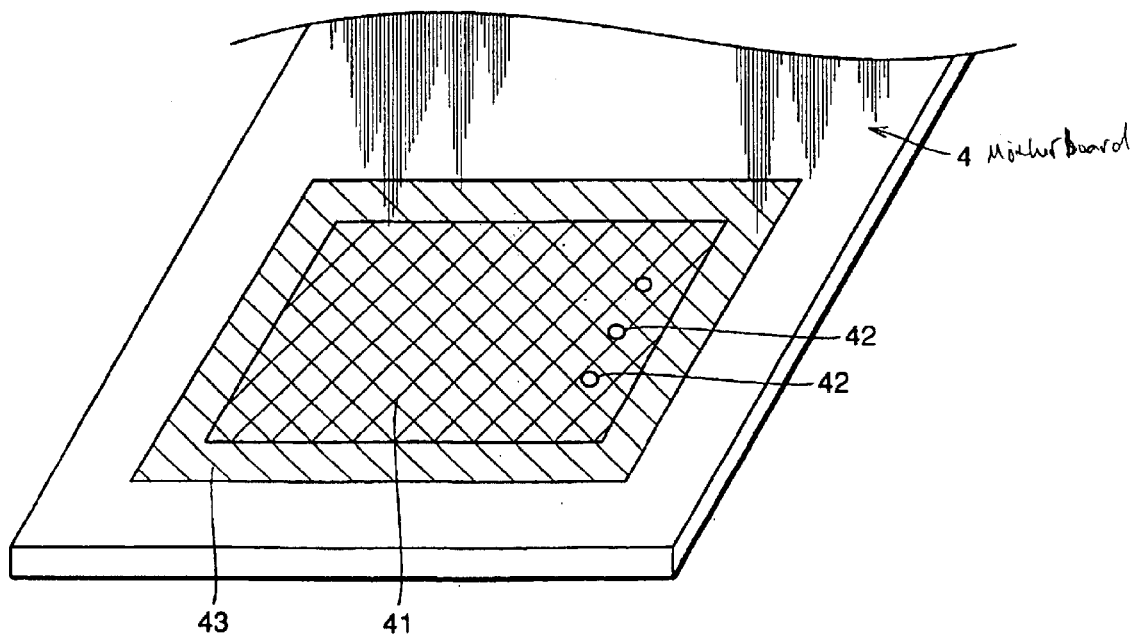
FIG. 2 is a perspective view of a mother board.

Description will now be made of mother board 4 to which RF circuit module 1 is to be mounted. As shown in FIG. 2, mother board 4 is provided with a first conductor of metal 41 arranged at the entirety of a region where RF circuit module 1 is to be mounted (the meshed portion in FIG. 2). The first conductor of metal 41 has a portion provided with a plurality of terminal insertion holes 42 through which connection terminals 33 pass.

Furthermore, along an outer periphery of the first conductor of metal 41 is provided a second conductor of metal 43 to which the RF circuit module's frame 2 is to be soldered (the hatched portion in FIG. 2).

Assembly of RF Circuit Module 1

Figure 3:
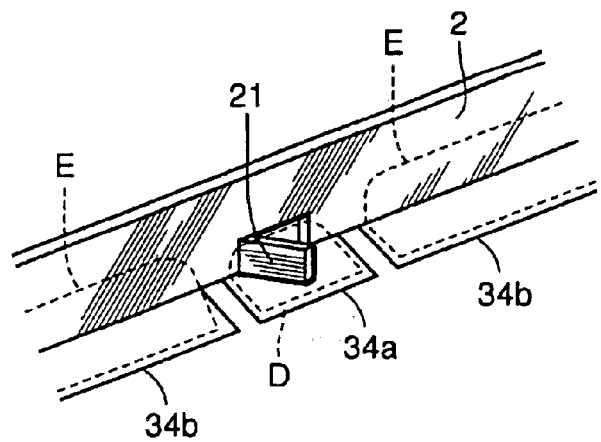
FIG. 3 is a view for illustrating how a printed circuit board is fit into a frame, with the frame's inside seen downwards.

Components 2, 3 and 4 thus configured are assembled to form RF circuit module 1 and RF circuit module 1 is mounted to mother board 4, as described below:

Initially, as shown in FIG. 1, printed circuit board 3 is fit into frame 2 from the frame's lower side until printed circuit board 3 abuts against protrusion 21. Then, as shown in FIG. 3, showing an inner side of frame 2 as seen downward, protrusion 21 and the first grounding conductor 34a are soldered together, as shown in FIG. 3 with a dashed region D, to electrically connect protrusion 21 and the first grounding conductor 34a together. The second grounding conductor 34b and an inner side surface of frame 2 are also soldered together, as shown in FIG. 3 with a dashed region E, to electrically connect them together. Printed circuit board 3 is thus assembled integral to frame 2 to complete RF circuit module 1. In such assembly, as has been described hereinbefore, the distance between the protrusion 21 lower edge and the frame 2 lower end, i.e., dimension B in FIG. 1 generally matches the printed circuit board 3 thickness, and the frame 2 lower end and the printed circuit board 3 lower surface are thus level with each other, as shown in FIG. 4, in which RF circuit module 1 is shown turned over. Furthermore, connection terminal 33 has an upper portion protruding slightly above the frame's upper end.

Then RF circuit module 1 is mounted to mother board 4. As shown in FIG. 4, RF circuit module 1 is turned over and the printed circuit board's connection terminal 33 is inserted into the mother board's terminal insertion hole 42 to mount RF circuit module 1 onto mother board 4. Thus RF circuit module 1 and mother board 4 are electrically connected together. Then the entire outer side periphery of frame 2 and the second conductor of metal 43 of mother board 4 are soldered together, as shown in FIG. 4 with a dashed region F. Thus RF circuit module 1 is mounted to mother board 4, with circuit components 32 and a circuit pattern (not shown) mounted to printed circuit board 3 and also completely shielded.

Effect of the Embodiment

As described above, in the present embodiment a lower surface of printed circuit board 3 (in FIG. 4, a surface thereof facing upwards) and an upper surface of mother board 4 that faces printed circuit board 3 are provided with conductors 35 and 41 of metal, respectively, each serving as a shield. More specifically, conductors 35 and 41 of metal each serve as a shield in a direction orthogonal to the plane of printed circuit board 3. The printed circuit board's outer periphery is also shielded by frame 2, as is conventional.

As such, in the present embodiment, printed circuit board 3 and mother board 4 each also serve as a shield. Thus the present embodiment can dispense with lids conventionally used to close a frame's upper and lower openings to shield a RF circuit module. As a result the number of components used can be reduced. This can also reduce the cost for components used and simplify the apparatus assembly process to reduce the cost for manufacturing the same.

The Second Embodiment

A second embodiment of the present invention will now be described. The present embodiment is a variation of printed circuit board 3 and will thus be described only in conjunction with its configuration.

Figure 5:
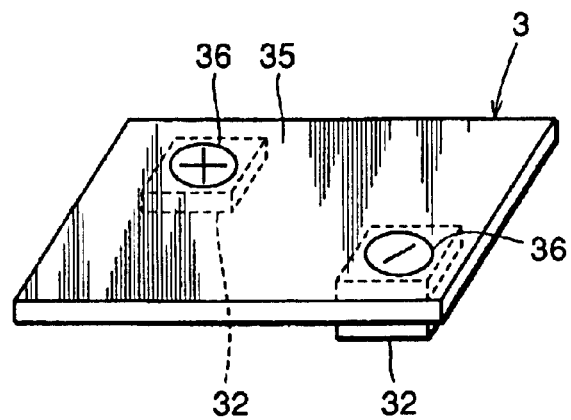
FIG. 5 is a perspective view of a printed circuit board according to a second embodiment of the present invention.

FIG. 5 shows printed circuit board 3 turned over, having a side with conductor of metal 35 facing upwards. As shown in the figure, printed circuit board 3 has mounted thereto adjustment components 32 used to adjust the RF circuit module's electrical performance, and printed circuit board 3 has adjustment holes 36 positioned opposite to adjustment components 32 to allow adjustment components 32 to be adjusted from the upper side as seen in FIG. 5, i.e., a side opposite to that with adjustment components 32 mounted thereto.

As such, even after RF circuit module 1 is mounted to mother board 4, adjustment holes 36 allow adjustment components 32 to be adjusted external to RF circuit module 1. As such the mobile phone's electrical performance can be appropriately, precisely adjusted, as required, and its high quality can thus be maintained.

Third Embodiment

A third embodiment of the present invention will now be described.

The present embodiment is a variation of mother board 4 and will thus be described in conjunction with its configuration.

Figure 6:
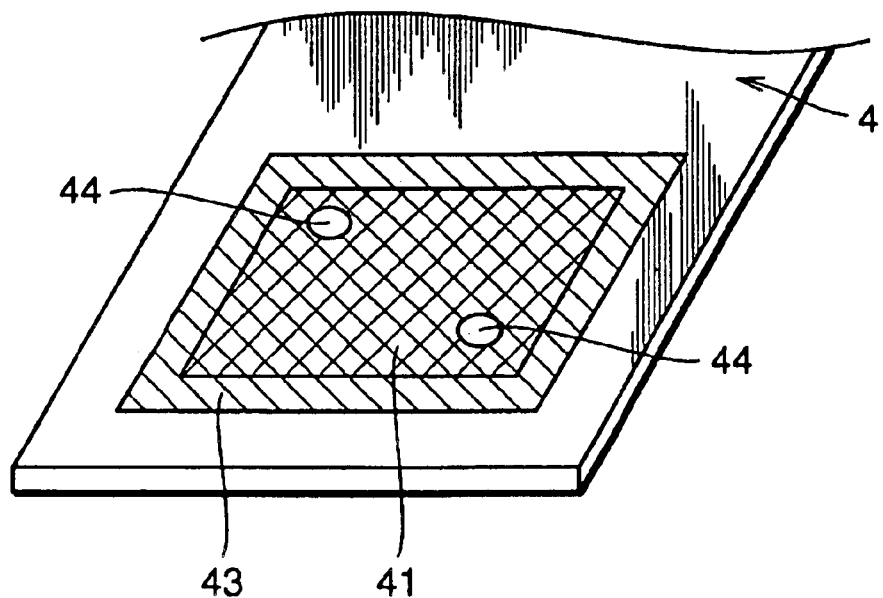
FIG. 6 is a perspective view of a mother board according to a third embodiment of the present invention.

As shown FIG. 6, mother board 4 is provided with the first conductor of metal 41, although those portions of the conductor opposite to adjustment components 32 are removed. Such portions will be referred to as removed portions 44. In other words, the first conductor of metal 41 is provided only at a region other than that where it faces adjustment components 32 (in FIG. 6, the meshed portion).

As such, adjustment components 32 are not electrically affected by the first conductor of metal 41. As such, RF circuit module 1 can have an electrical performance which does not vary when it is mounted to mother board 4, and RF circuit module 1 can thus achieve stable electrical performance. This can eliminate the necessity of adjusting adjustment components 32 after RF circuit module 1 is mounted to mother board 4 and hence the necessity of providing adjustment holes 3G as described in the second embodiment.

Fourth Embodiment

A fourth embodiment of the present invention will now be described.

The present embodiment relates to an improvement for adjusting adjustment components 32 in fabricating RF circuit module 1.

Figure 7:
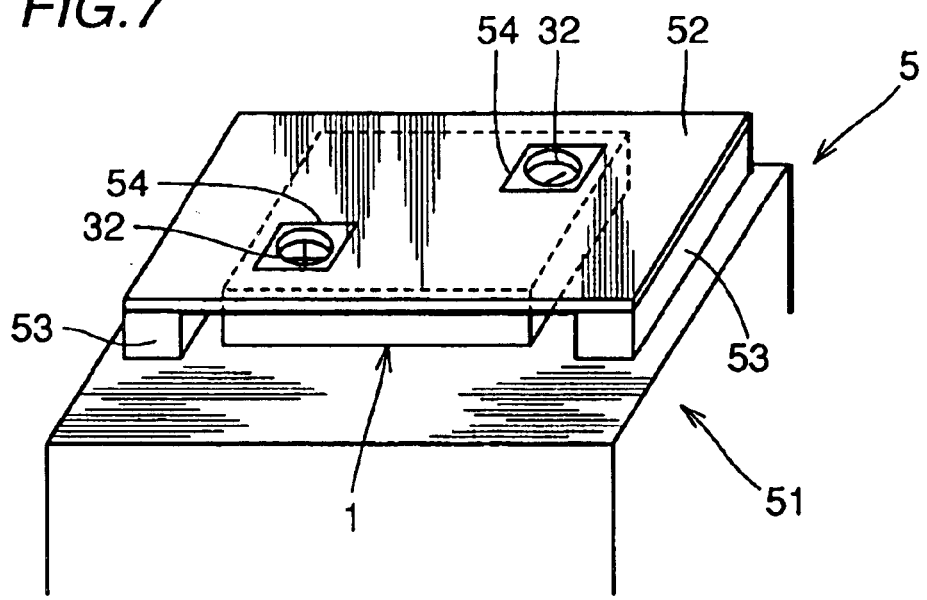
FIG. 7 is a view of a RF circuit module attached to an adjusting jig according to a fourth embodiment of the present invention.

FIG. 7 is shows an adjusting jig 5 for adjusting adjustment components 32, with RF circuit module 1 mounted thereto. Adjusting jig 5 includes a platform 51 and an adjusting conductor of metal 52. Adjusting conductor of metal 52 is arranged to cover an upper side of RF circuit module 1 mounted on platform 51. Adjusting conductor of metal 52, imitating the mother board's first conductor of metal 41, is for example of a tape of copper foil. On the conductor 52 lower surface along opposite sides are attached spacers 53 for creating between conductor 52 and the platform's upper surface a space for arranging RF circuit module 1. Adjusting conductor of metal 52 is also provided with adjustment holes 54 positioned opposite to adjustment components 32 of RF circuit module 1.

In using adjusting jig 5 to adjust adjustment components 32, RF circuit module 1 is mounted on platform 51, with the printed circuit board's circuit components 32 and the like facing upwards. Then the RF circuit module's upper side is covered by adjusting conductor of metal 52. Thus, RF circuit module 1 and adjusting conductor of metal 52 are positionally equivalent to RF circuit module 1 mounted to mother board 4 and mother board 4, respectively. In this equivalent positional relationship, the conductor's adjustment holes 54 are used to adjust adjustment components 32 precisely to allow RF circuit module 1 to achieve optimal, electrical performance.

Then, RF circuit module 1 is removed from adjusting jig 5, and mounted to mother board 4, as has been described hereinbefore.

Since adjustment jig 5 is used to assume that RF circuit module 1 is mounted to mother board 4 and thus adjust adjustment parts 32, RF circuit module 1 can have an electrical performance having been optimally adjusted before it is mounted to mother board 4. In other words, how the mother board's conductors of metal 41 and 43 affect RF circuit module 1 is considered previously in adjusting RF circuit module 1. Thus RF circuit module 1 upon mounted to mother board 4 is also RF circuit module 1 having optimal electrical performance. This eliminates the necessity of adjusting adjustment components 32 after RF circuit module 1 is mounted to mother board 4. As a result mother board 4 does not need to be processed to prevent conductors of metal 41 and 43 from affecting RF circuit module 1, as in the third embodiment, and the number of process steps for fabricating the apparatus can thus be reduced.

Fifth Embodiment

A fifth embodiment of the present invention will now be described. The present embodiment relates to an improvement for miniaturizing RF circuit module 1.

Figure 8:
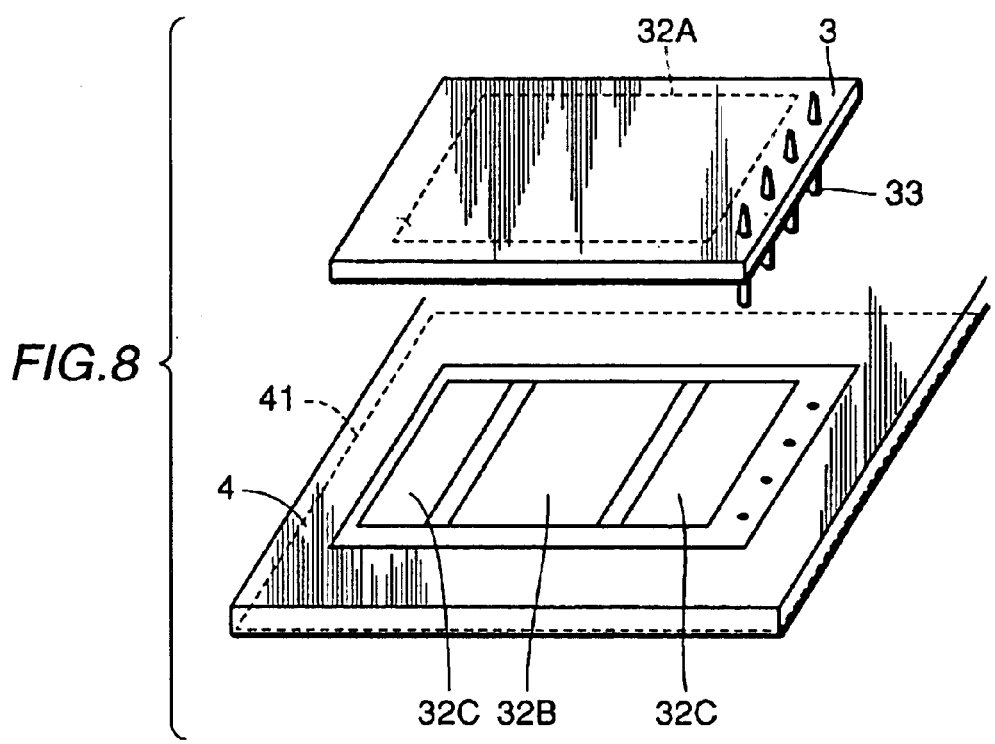
FIG. 8 shows how a RF circuit module and a mother board are assembled together in a fifth embodiment.
Figure 9:
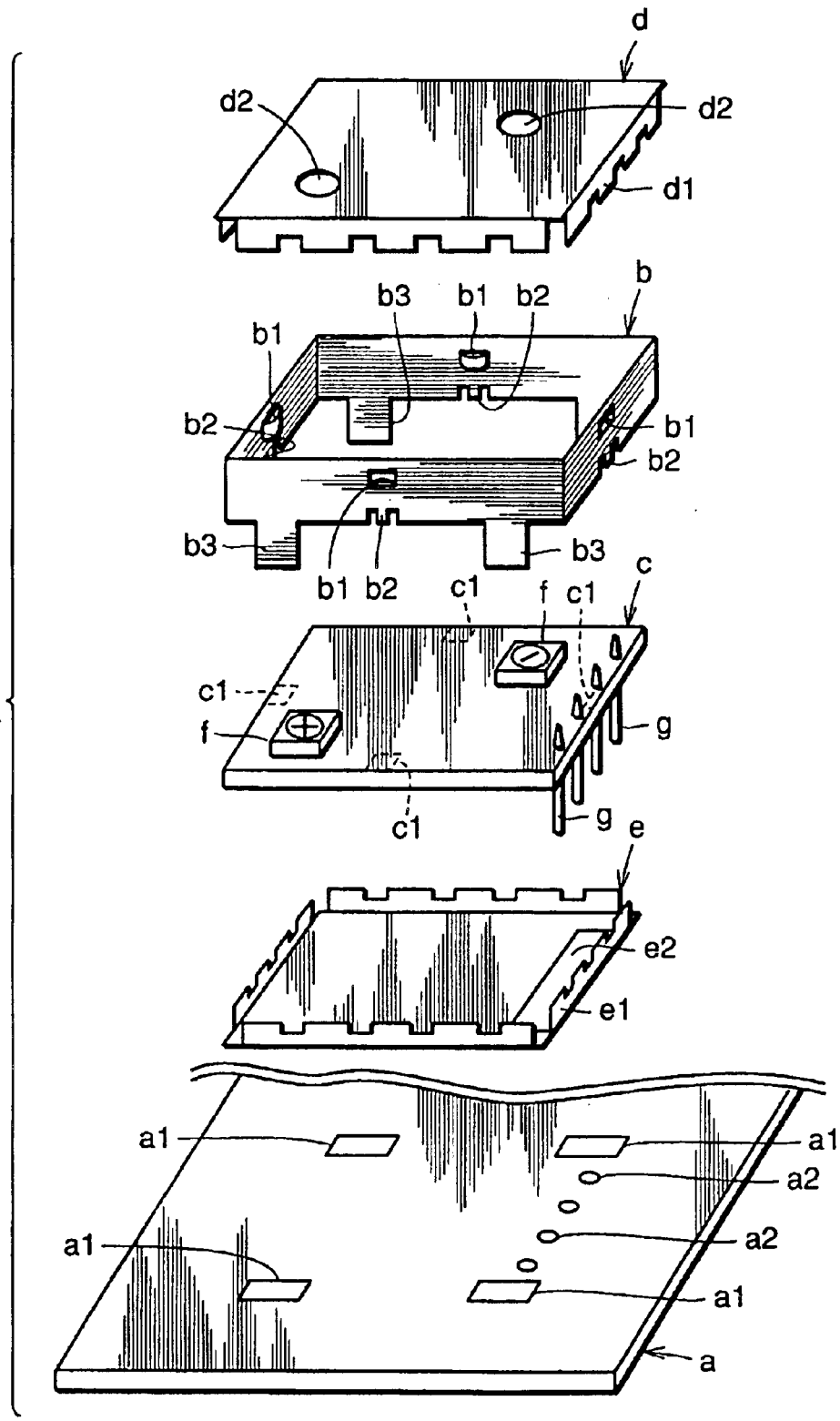
FIG. 9 is an exploded, perspective view of a conventional RF circuit module and a perspective view of a mother board.
Figure 10:
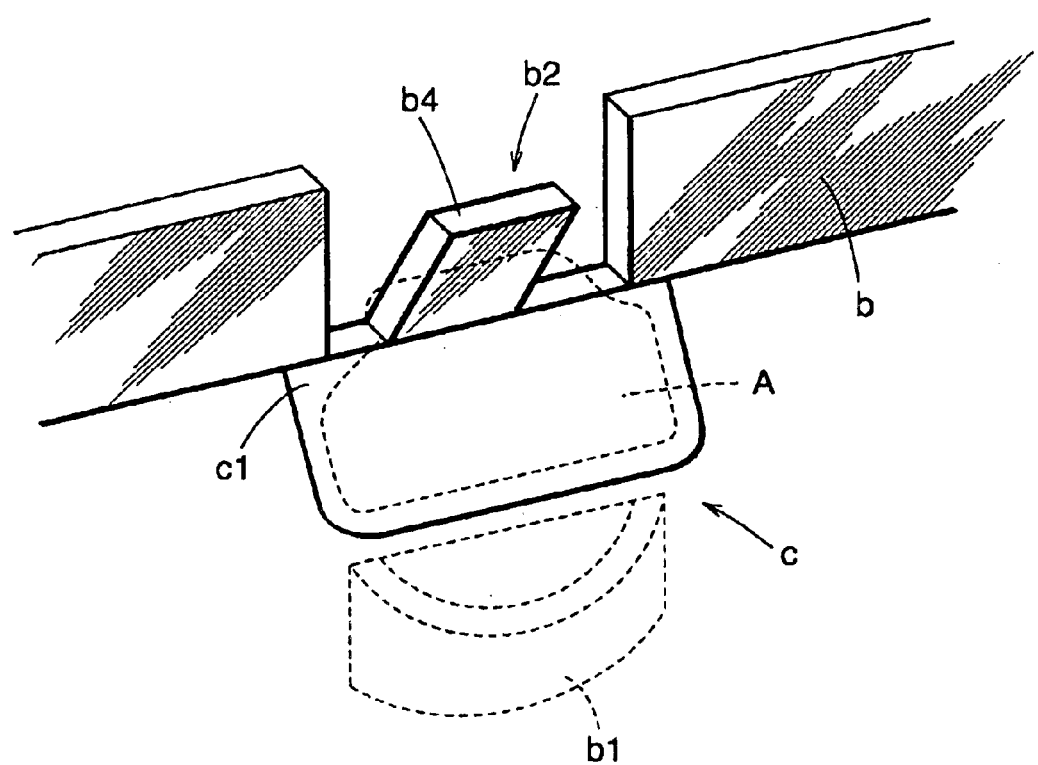
FIG. 10 is a view for illustrating how a conventional printed circuit board is fit into a frame.

FIG. 8 shows how RF circuit module 1 (with the frame omitted) and mother board 4 in the present embodiment are assembled together. In the present embodiment, some of the circuit components mounted to RF circuit module 1 are mounted to mother board 4. More specifically, a circuit component operating at a time is mounted to printed circuit board 3 and that operating at another time is mounted to mother board 4. For example, for a time-division communication system with a transmitter's circuit component 32A operating at a time and a receiver's circuit component 32B operating at another time, the transmitter's circuit component 32A is mounted to printed circuit board 3 on one surface thereof (in FIG. 8, on a lower surface thereof) and the receiver's circuit component 32B and circuit components 32C commonly used in both transmission and reception are mounted to mother board 4 on one surface thereof (in FIG. 8, on an upper surface thereof) opposite to one surface of printed circuit board 3. Thus, circuit components 32A, 32B, 32C respectively mounted to printed circuit board 3 and mother board 4 can operate without electrically or magnetically interfering with each other.

As such, printed circuit board 3 does not require a large area, and as RF circuit module 1 is miniaturized the mobile phone can also be miniaturized.

In the present embodiment, to shield a circuit component mounted to mother board 4 a shielding conductor of metal 41 must be provided on the mother board's back surface.

While in the present embodiment a transmitter's circuit component 32A is mounted to printed circuit board 3 and a receiver's circuit component 32B is mounted to mother board 4, they may be mounted vise versa. Furthermore, circuit components 32C used for both transmission and reception may be mounted to either printed circuit board 3 or mother board 4, or one may be allotted to printed circuit board 3 and another to mother board 4.

Other Embodiments

While the present embodiments have been described in conjunction with a mobile phone adopted as a communication apparatus, the present invention is not limited thereto and it is applicable to cordless phones and other types of communication apparatuses.

Furthermore, while printed circuit board 3 is provided with shielding conductor of metal 35 for example stuck to a lower surface thereof, it may be provided with a shielding conductor of metal in the form of a layer internal thereto.

Furthermore, while the present embodiments provide printed circuit board 3 and mother board 4 both functioning as a shield, the present invention also includes a technical concept that only one of printed circuit board 3 and mother board 4 also serves as a shield whereas the other is covered by a conventional shielding lid.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A communication apparatus comprising:
   a radio frequency circuit module, and
   a mother board having one surface with said radio frequency circuit module mounted thereto, said radio frequency circuit module including:
      a shielding frame,
      a printed circuit board having one and the other surfaces and accommodated in and held by said shielding frame,
      a circuit component mounted on said one surface of said printed circuit board, and
      a shielding conductor arranged on said other surface of said printed circuit board or inside said printed circuit board and having a shape substantially matching a planar shape of said printed circuit board, wherein said radio frequency circuit module is mounted on said one surface of said mother board such that said one surface of said printed circuit board faces said one surface of said mother board;
   a shielding conductor arranged on said one surface of said mother board where said radio frequency circuit module is mounted; and
   another shielding conductor surrounding said shielding conductor arranged on said one surface of said mother board where said radio frequency circuit module is mounted, said another shielding conductor being joined to said shielding frame.

2. A communication apparatus comprising:
   a radio frequency circuit module, and
   a mother board having one surface with said radio frequency circuit module mounted thereto, said radio frequency circuit module including:
      a shielding frame,
      a printed circuit board having one and the other surfaces and accommodated in and held by said shielding frame,
      a circuit component mounted on said one surface of said printed circuit board, and
      a shielding conductor arranged on said other surface of said printed circuit board or inside said printed circuit board and having a shape substantially matching a planar shape of said printed circuit board, wherein said radio frequency circuit module is mounted on said one surface of said mother board such that said one surface of said printed circuit board faces said one surface of said mother board;
   a first circuit component mounted on said one surface of said printed circuit board; and
   a second circuit component mounted on said one surface of said mother board, opposite to said first circuit component.

3. The communication apparatus of claim 2, wherein said first circuit component includes one of a transmitter's circuit component and a receiver's circuit component and said second circuit component includes the other of the transmitter's circuit component and the receiver's circuit component.

4. A communication apparatus comprising:
   a radio frequency circuit module,
   a mother board to which said radio frequency circuit module is to be mounted, said radio frequency circuit module including:
      a shielding frame, and
      a printed circuit board accommodated in and held by said shielding frame, and
   a shielding conductor arranged at that portion of said mother board where said radio frequency circuit module is mounted; and
   another shielding conductor surrounding said shielding conductor arranged on one surface of said mother board where said radio frequency circuit module is mounted, said another shielding conductor being joined to said shielding frame.

5. A communication apparatus comprising:
   a radio frequency circuit module,
   a mother board to which said radio frequency circuit module is to be mounted, said radio frequency circuit module including:
      a shielding frame, and
      a printed circuit board accommodated in and held by said shielding frame, and
   a shielding conductor arranged at that portion of said mother board where said radio frequency circuit module is mounted;
   a first circuit component mounted on one surface of said printed circuit board; and
   a second circuit component mounted on one surface of said mother board, opposite to said first circuit component.

6. The communication apparatus of claim 5, wherein said first circuit component includes one of a transmitter's circuit component and a receiver's circuit component and said second circuit component includes the other of the transmitter's circuit component and the receiver's circuit component.

* * * * *